United States Patent [19]
Sato et al.

[11] Patent Number: 5,857,826
[45] Date of Patent: Jan. 12, 1999

[54] WORK TRANSPORTING ROBOT AND SEMICONDUCTOR DEVICE MANUFACTURING APPARATUS

[75] Inventors: Naoyuki Sato; ken-ich Kawata, both of Settu, Japan

[73] Assignee: Daikin Industries, Inc., Osaka, Japan

[21] Appl. No.: 787,564

[22] Filed: Jan. 22, 1997

[51] Int. Cl.⁶ ...................................................... B25J 18/02
[52] U.S. Cl. ........................ 414/744.6; 901/15; 74/470.1; 414/217
[58] Field of Search ............................. 414/744.5, 744.6, 414/917, 217; 901/15, 28; 74/479.01, 490.05, 490.08, 490.09, 490.01

[56] References Cited

U.S. PATENT DOCUMENTS 5,647,724  7/1997  Davis, Jr. ............................... 901/15 X Primary Examiner—Donald W. Underwood
Attorney, Agent, or Firm—Beveridge, DeGrandi, Weilacher & Young, LLP

[57] ABSTRACT

A work transporting robot includes a first, second and third arms each of which is rotationally moved around a common axis by individual driving source within a plane, the plane being parallel to one another, a pair of first coupled arms each of which is rotatably connected its one end to a leading edge section of the second arm which is disposed intermediate position of the first and third arms, and a leading edge section of one of the first and third arms, a first work supporting table which is connected to the other end of the pair of first coupled arms, a pair of second coupled arms each of which is rotatably connected its one end to a leading edge section of the second arm which is disposed intermediate position of the first and third arms, and a leading edge section of the other of the first and third arms, and a second work supporting table which is connected to the other end of the pair of second coupled arms, and wherein the first and third arms are disposed in the same side to one another with respect to a plane which includes the axis and the second arm.

8 Claims, 21 Drawing Sheets

WORK TRANSPORTING ROBOT AND SEMICONDUCTOR DEVICE MANUFACTURING APPARATUS

BACKGROUND OF THE INVENTION

The present invention relates to a work transporting robot and semiconductor device manufacturing apparatus. More particularly, the present invention relates to a work transporting robot which is preferably incorporated in a semiconductor device manufacturing system and which transports a semiconductor wafer to a desired process chamber for manufacturing semiconductor device and puts the semiconductor wafer into and out from the process chamber. The present invention also relates to a semiconductor device manufacturing apparatus in which the work transporting robot is incorporated.

From past, a work transporting robot is proposed (refer to Japanese Patent Publication Gazette No. Hei 7-73833, and Japanese Patent Laid-Open Publication Gazette No. Hei 7-504128) which robot is incorporated in a system for manufacturing semiconductor device and which robot transports a semiconductor wafer to a desired process chamber for manufacturing semiconductor device and puts the semiconductor wafer into and out from the process chamber.

The work transporting robot recited in Japanese Patent Publication Gazette No. Hei 7-73833 disposes a pair of joint linkages in positions which are shifted 180 degrees from one another, and includes a first driving source for driving each joint linkage and a second driving source for driving both joint linkages in directions which are the same direction to one another. Therefore, each joint linkage is independently telescopically moved and both joint linkages are rotationally moved in directions which are the same direction to one another so that a semiconductor wafer can be transported to a desired process chamber for manufacturing semiconductor device and the semiconductor wafer can be put into and out from the process chamber.

The work transporting robot recited in Japanese Patent Laid-Open Publication Gazette No. Hei 7-504128 disposes a pair of joint linkages in positions which are shifted 180 degrees from one another, and includes a first driving source for driving each joint linkage and a second driving source for driving both joint linkages in directions which are the same direction to one another. Therefore, each joint linkage is independently telescopically moved and both joint linkages are rotationally moved in directions which are the same direction to one another so that a semiconductor wafer can be transported to a desired process chamber for manufacturing semiconductor device and the semiconductor wafer can be put into and out from the process chamber.

In both work transporting robot, both joint linkages are disposed in positions which are shifted 180 degrees from one another. Therefore, when semiconductor wafers are reshuffled with respect to any one of process chambers for manufacturing semiconductor device, one joint linkage is telescopically moved so that a first semiconductor wafer is put out from the process chamber, thereafter both joint linkages are rotationally moved by 180 degrees, then the other joint linkage is telescopically moved so that a second semiconductor wafer is put into the process chamber. Consequently, a time for rotationally moving both joint linkages by 180 degrees becomes a waste time so that a processing speed in the entirety of a semiconductor device manufacturing system cannot be improved too much.

In a semiconductor device manufacturing system, four to five process chambers for manufacturing semiconductor device are generally disposed. About eight number of times of processings for putting a semiconductor wafer into and out from a process chamber are required for one semiconductor wafer in average. Processing time for one semiconductor wafer is about 1–3 minutes. Each semiconductor wafer is applied processings within 2–4 process chambers for manufacturing semiconductor device. Therefore, the time for rotational movement is a fairly waste time with respect to an entire processing time.

Further, when corresponding joint linkage is telescopically moved prior to and after the rotational movement by 180 degrees of both joint linkage, an isolation valve should be opened which isolates corresponding process chamber for manufacturing semiconductor device from a space in which a work transporting robot is disposed. Therefore, a total time during when an isolation valve is not closed becomes longer so that a degree of cleanness of a space in which a work transporting robot is disposed may be lowered and a desired degree of cleanness may not be obtained. The degree of cleanness affects a process chamber for manufacturing semiconductor device. Therefore, the degree of cleanness cannot be ignored when semiconductor device is to be manufactured.

FIGS. 11(A) through 11(J) are diagrams schematically illustrating a sequence of putting a semiconductor wafer into and out from a process chamber by a conventional work transporting robot, while FIG. 12 is a flowchart.

As is apparent from these figures and the flowchart, it is waited until processing for a semiconductor wafer A has finished. Then, an isolation valve of a process chamber for manufacturing semiconductor device is opened and the semiconductor wafer A is put out from the process chamber, thereafter the isolation gate valve is closed. Then, both joint linkages are rotationally moved. The isolation gate valve of the process chamber for manufacturing semiconductor device is opened and a semiconductor B is put into the process chamber, thereafter the isolation gate valve is closed.

Therefore, it is understood a reason why the above-mentioned disadvantages arise.

Description was made for a case in which a work transporting robot is applied to a semiconductor device manufacturing system. Similar disadvantages arise when a work transporting robot is applied a system which requires putting work into and out from a chamber and which system is other than a semiconductor device manufacturing system.

SUMMARY OF THE INVENTION

It is an object of the present invention to shorten a total required time for processing by omitting necessity of rotational movement of joint linkages.

It is another object of the present invention to maintain a high degree of cleanness within a space in which a work transporting robot is disposed, when the work transporting robot is applied to a semiconductor device manufacturing system.

A work transporting robot according to the present invention comprises, more than one arms each of which is rotationally moved by a driving source around an axis and within a plane, the driving source being different from another driving source, the axis being common for every arm, and the plane being parallel to one another, and coupled arms each of which has a work supporting table at its leading edge section, and wherein the arms and coupled arms are connected so that a movement of one of the work supporting tables in an apart direction from the axis and a movement of another of the work supporting table in a closing direction to the axis are performed simultaneously to one another following to the rotational movement of the arms, the both movements are in a same side with respect to the axis.

When the work transporting robot is employed, a desired work supporting table is moved to and fro in a radial direction by rotationally moving the arms in desired directions. Of course, the work supporting tables are rotationally moved to desired rotational positions by rotationally moving all arms in the same direction to one another. Consequently, a waste operation such as rotationally moving all arms by 180 degrees is not needed so that exchanging a work is performed with a shorter time.

Another work transporting robot according to the present invention comprises, a first, second and third arms each of which is rotationally moved around a common axis by individual driving source within a plane, the plane being parallel to one another, a pair of first coupled arms each of which is rotatably connected its one end to a leading edge section of the second arm which is disposed intermediate position of the first and third arms, and a leading edge section of one of the first and third arms, a first work supporting table which is connected to the other end of the pair of first coupled arms, a pair of second coupled arms each of which is rotatably connected its one end to a leading edge section of the second arm which is disposed intermediate position of the first and third arms, and a leading edge section of the other of the first and third arms, and a second work supporting table which is connected to the other end of the pair of second coupled arms, and wherein the first and third arms are disposed in the same side to one another with respect to a plane which includes the axis and the second arm.

When the work transporting robot is employed, one of the work supporting table is moved to and fro in a radial direction by rotationally moving the first or third arm and the second arm in reversed directions from one another. And, the other work supporting table is rotationally moved without moving to and fro in a radial direction by rotationally moving the third or first arm and the second arm in the same direction to one another. Of course, all work supporting tables are rotationally moved to desired rotational positions by rotationally moving all arms in the same direction to one another. Consequently, a waste operation such as rotationally moving all arms by 180 degrees is not needed so that exchanging a work is performed with a shorter time.

It is preferable that a plurality of process chambers for manufacturing semiconductor device are disposed in correspondence to predetermined rotation positions of the work supporting tables around the axis, and a controlling means is further provided for controlling the driving sources which rotationally moves the first, second and third arms in the same directions to one another by the same angles to one another when one of the work supporting tables is to be opposite to any one of the process chambers for manufacturing semiconductor device, and rotationally moves the first and second arms or the second and third arms in reversed directions to one another and rotationally moves the remaining arm in a direction which is the same to the direction of the second arm when exchanging of a semiconductor wafer for the process chamber for manufacturing semiconductor device.

When the work transporting robot is employed, one of the work supporting table is moved to and fro in a radial direction by rotationally moving the first or third arm and the second arm in reversed directions from one another by the controlling means. And, the other work supporting table is rotationally moved without moving to and fro in a radial direction by rotationally moving the third or first arm and the second arm in the same direction to one another by the controlling means. Of course, all work supporting tables are rotationally moved to desired rotational positions by rotationally moving all arms in the same direction to one another by the controlling means. Consequently, a waste operation such as rotationally moving all arms by 180 degrees is not needed so that exchanging a work for a process chamber for manufacturing semiconductor device is performed with a shorter time. Further, putting out from and into of a semiconductor wafer is performed under a condition that the isolation gate valve of the process chamber for manufacturing semiconductor device is opened once. Therefore, a time during when the isolation gate valve is not closed can be shortened in comparison to a case in which an isolation gate valve is opened and closed prior to and after a rotational moving of all arms by 180 degrees. As a result, a quantity of impurity particles flowing out from a process chamber for manufacturing semiconductor device is decreased so that an improved degree of cleanness is achieved.

A further work transporting robot according to the present invention comprises, a first and second arms each of which is rotationally moved around a common axis by individual driving source within a plane, the plane being parallel to one another, the first and second arms being connected to the axis at their central sections, and lengths to each edge section with respect to the axis are determined to be different lengths from one another, and coupled arms each of which is rotatably connected to edge sections of the corresponding arm, the coupled arm connected to one edge section of one of the arms and the coupled arm connected to one edge section of another of the arms being connected to one another at predetermined positions, and a work supporting table is further provided which is connected to a leading edge section of one of the coupled arms, the coupled arm connected to another edge section of one of the arms and the coupled arm connected to another edge section of another of the arms being connected to one another at predetermined positions, and a work supporting table is further provided which is connected to a leading edge section of one of the coupled arms.

When the work transporting robot is employed, one of the work supporting table is moved to and fro in a radial direction and the other work supporting table is slightly moved to and fro in a radial direction and slightly rotationally moved around the axis by rotationally moving the arms in desired directions. Of course, all work supporting tables are rotationally moved to desired rotational positions by rotationally moving all arms in the same direction to one another. Consequently, a waste operation such as rotationally moving all arms by 180 degrees is not needed so that exchanging a work is performed with a shorter time.

It is preferable that a plurality of process chambers for manufacturing semiconductor device are disposed in correspondence to predetermined rotation positions of the work supporting tables around the axis, and a controlling means is further provided for controlling the driving sources which rotationally moves the first and second arms in the same directions to one another by the same angles to one another when one of the work supporting tables is to be opposite to any one of the process chambers for manufacturing semiconductor device, and rotationally moves the first and second arms in the same directions to one another by different angles from one another when exchanging of a semiconductor wafer for the process chamber for manufacturing semiconductor device.

When the work transporting robot is employed, one of the work supporting table is moved to and fro in a radial direction and the other work supporting table is slightly moved to and fro in a radial direction and slightly rotationally moved around the axis by rotationally moving the first or third arm and the second arm in desired directions by the controlling means. Of course, all work supporting tables are rotationally moved to desired rotational positions by rotationally moving all arms in the same direction to one another by the controlling means. Consequently, a waste operation such as rotationally moving all arms by 180 degrees is not needed so that exchanging a work for a process chamber for manufacturing semiconductor device is performed with a shorter time. Further, putting out from and into of a semiconductor wafer is performed under a condition that the isolation valve of the process chamber for manufacturing semiconductor device is opened once. Therefore, a time during when the isolation valve is not closed can be shortened in comparison to a case in which an isolation valve is opened and closed prior to and after a rotational moving of all arms by 180 degrees. As a result, a quantity of impurity particles flowing out from a process chamber for manufacturing semiconductor device is decreased so that an improved degree of cleanness is achieved.

A semiconductor device manufacturing apparatus according to the present invention comprises, a central chamber, a plurality of process chambers each of which is disposed at a predetermined position of the central chamber, and a work transporting robot which is incorporated in the central chamber, and the work transporting robot includes, more than one arms each of which is rotationally moved by a driving source around an axis and within a plane, the driving source being different from another driving source, the axis being common for every arm, and the plane being parallel to one another, and coupled arms each of which has a work supporting table at its leading edge section, and wherein the arms and coupled arms are connected so that a movement of one of the work supporting tables in an apart direction from the axis and a movement of another of the work supporting table in a closing direction to the axis are performed simultaneously to one another following to the rotational movement of the arms, the both movements are in a same side with respect to the axis.

When the semiconductor device manufacturing apparatus is employed, a waste operation such as rotationally moving all arms by 180 degrees is not needed so that exchanging a work is performed with a shorter time. Therefore, a semiconductor device can be manufactured with a shorter time.

Another semiconductor device manufacturing apparatus according to the present invention comprises, a central chamber, a plurality of process chambers each of which is disposed at a predetermined position of the central chamber, and a work transporting robot which is incorporated in the central chamber, and the work transporting robot includes, a first, second and third arms each of which is rotationally moved around a common axis by individual driving source within a plane, the plane being parallel to one another, a pair of first coupled arms each of which is rotatably connected its one end to a leading edge section of the second arm which is disposed intermediate position of the first and third arms, and a leading edge section of one of the first and third arms, a first work supporting table which is connected to the other end of the pair of first coupled arms, a pair of second coupled arms each of which is rotatably connected its one end to a leading edge section of the second arm which is disposed intermediate position of the first and third arms, and a leading edge section of the other of the first and third arms, and a second work supporting table which is connected to the other end of the pair of second coupled arms, and wherein the first and third arms are disposed in the same side to one another with respect to a plane which includes the axis and the second arm.

When the semiconductor device manufacturing apparatus is employed, a waste operation such as rotationally moving all arms by 180 degrees is not needed so that exchanging a work is performed with a shorter time. Therefore, a semiconductor device can be manufactured with a shorter time.

A further semiconductor device manufacturing apparatus according to the present invention comprises, a central chamber, a plurality of process chambers each of which is disposed at a predetermined position of the central chamber, and a work transporting robot which is incorporated in the central chamber, and the work transporting robot includes, a first and second arms each of which is rotationally moved around a common axis by individual driving source within a plane, the plane being parallel to one another, the first and second arms being connected to the axis at their central sections, and lengths to each edge section with respect to the axis are determined to be different lengths from one another, and coupled arms each of which is rotatably connected to edge sections of the corresponding arm, the coupled arm connected to one edge section of one of the arms and the coupled arm connected to one edge section of another of the arms being connected to one another at predetermined positions, and a work supporting table is further provided which is connected to a leading edge section of one of the coupled arms, the coupled arm connected to another edge section of one of the arms and the coupled arm connected to another edge section of another of the arms being connected to one another at predetermined positions, and a work supporting table is further provided which is connected to a leading edge section of one of the coupled arms.

When the semiconductor device manufacturing apparatus is employed, a waste operation such as rotationally moving all arms by 180 degrees is not needed so that exchanging a work is performed with a shorter time. Therefore, a semiconductor device can be manufactured with a shorter time.

PREFERRED EMBODIMENT OF THE PRESENT INVENTION

Figure 1:
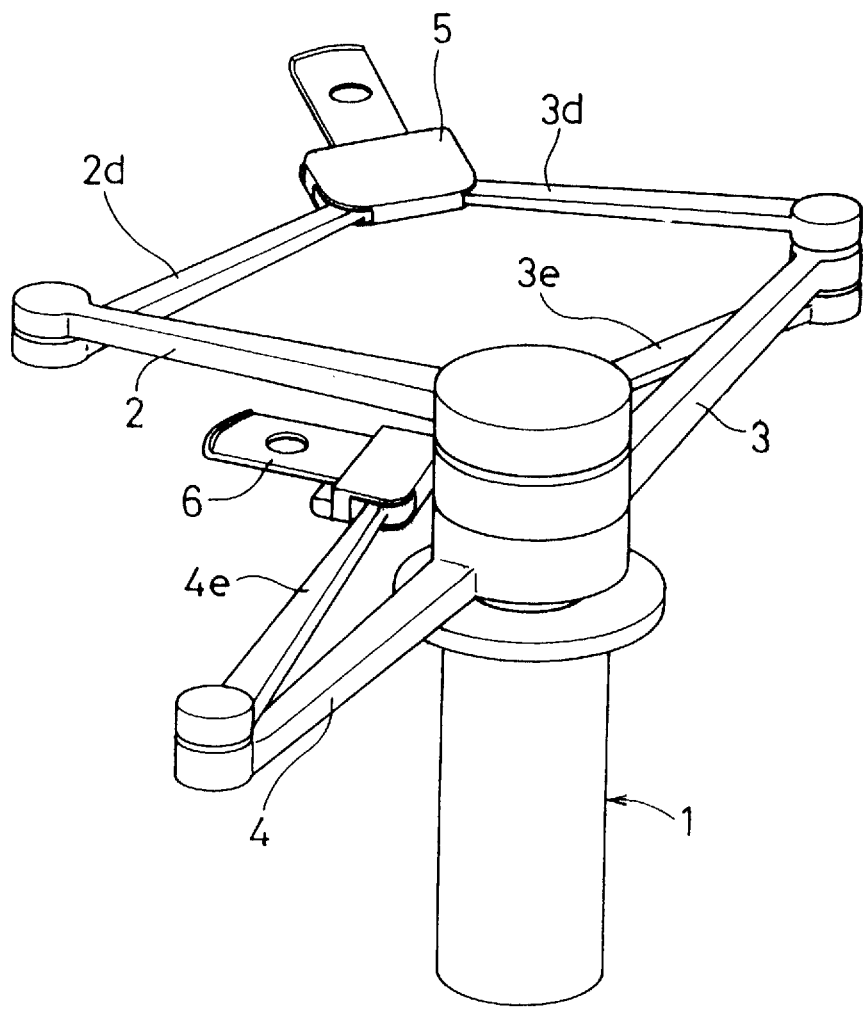
FIG. 1 is a perspective view schematically illustrating a main portion of a work transporting robot of an embodiment according to the present invention.
Figure 2:
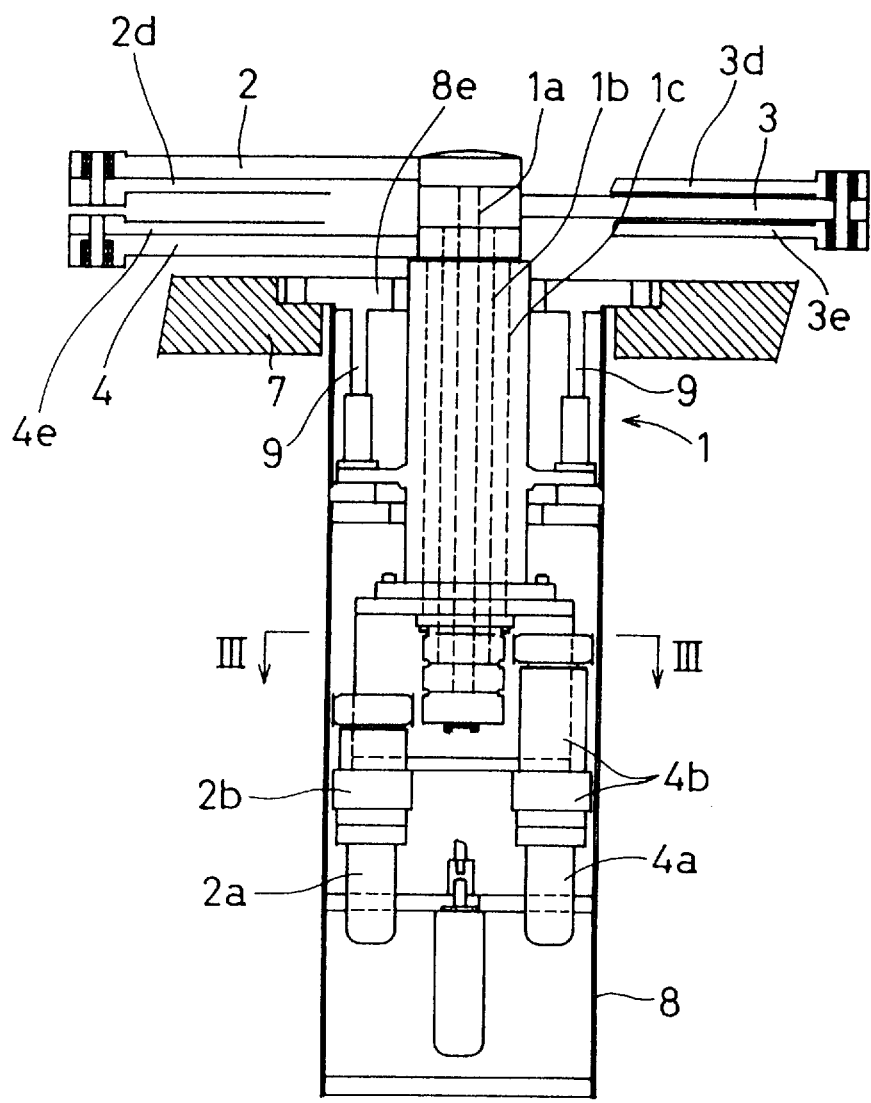
FIG. 2 is a central vertical cross sectional view of the work transporting robot.
Figure 3:
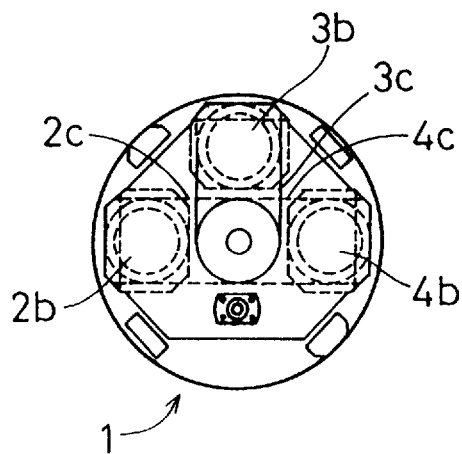
FIG. 3 is a cross sectional view taken along a line III—III in FIG. 2.
Figure 4:
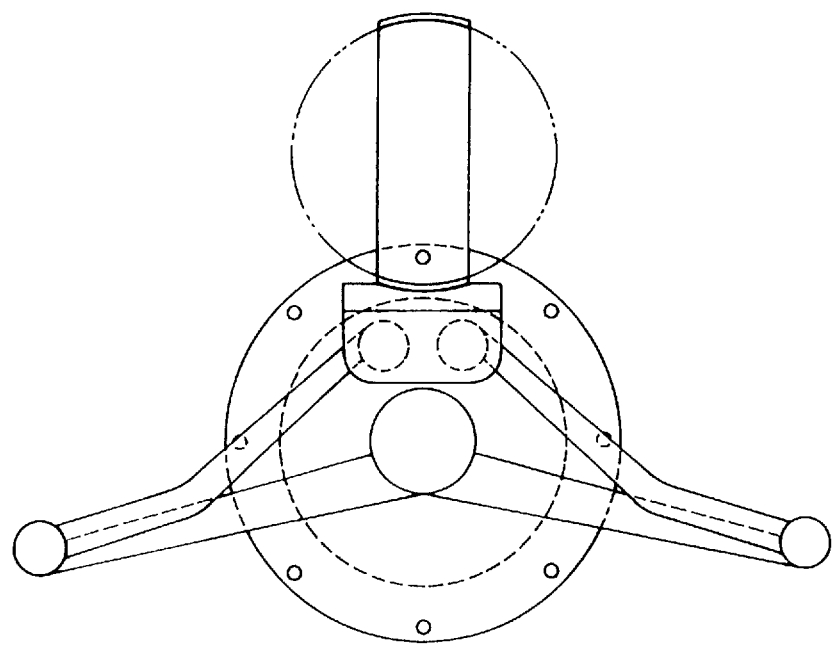
FIG. 4 is a plan view of the work transporting robot.
Figure 5:
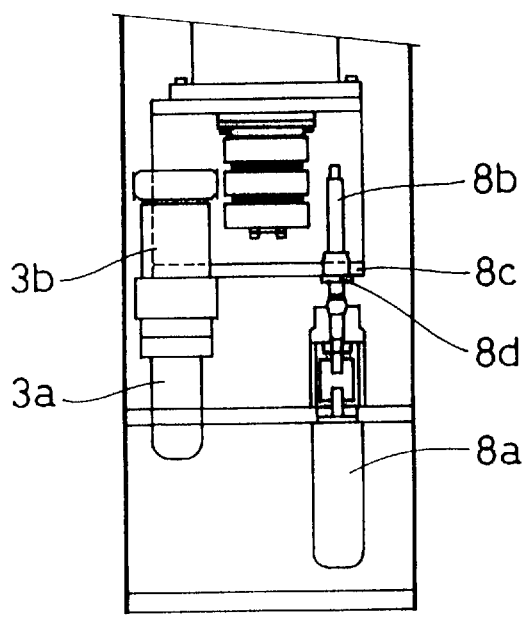
FIG. 5 is a cross sectional view illustrating a mechanism for moving the work transporting robot upward and downward.

FIG. 1 is a perspective view schematically illustrating a main portion of a work transporting robot of an embodiment according to the present invention, FIG. 2 is a central vertical cross sectional view of the work transporting robot, FIG. 3 is a cross sectional view taken along a line III—III in FIG. 2, FIG. 4 is a plan view of the work transporting robot, and FIG. 5 is a cross sectional view illustrating a mechanism for moving the work transporting robot upward and downward.

The work transporting robot includes a rotation axis unit 1 and a first, second and third arms 2, 3 and 4. The rotation axis unit 1 has a coaxial three axes arrangement. The rotation axis unit 1 independently rotationally moves the first, second and third arms 2, 3 and 4, respectively. The rotation axis unit 1 and each arm may be directly connected to one another. It is preferable that the rotation axis unit 1 and each arm are connected by a magnetic coupler through a wall of a vacuum case as is illustrated in Japanese Patent Laid-Open Gazette No. Hei 6-241237, when the work transporting robot is used for a purpose which requires a high degree of cleanness.

Each rotation axis 1a, 1b and 1c of the rotation axis unit 1 is connected to each speed reducer 2b, 3b and 4b by each belt 2c, 3c and 4c, respectively. Each speed reducer 2b, 3b and 4b is provided to each motor 2a, 3a and 4a for rotationally moving each arm, respectively. Of course, motors 2a, 3a and 4a for rotationally moving each arm are controlled their rotating directions and rotating speed by controlling sections, respectively.

Figure 6:
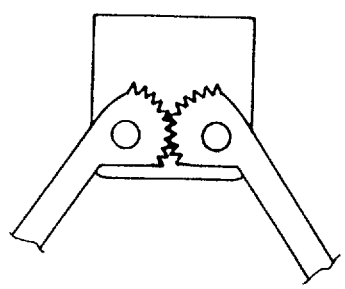
FIG. 6 is a diagram schematically illustrating a connection of couples arms and a first work supporting table of an example.
Figure 7:
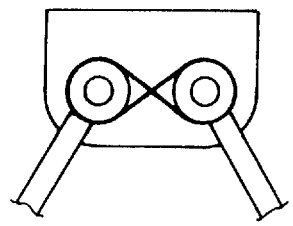
FIG. 7 is a diagram schematically illustrating a connection of couples arms and a first work supporting table of another example.

A follower arm 2d is rotatably connected its base section to a bottom face of a leading edge section of the first arm 2, and a follower arm 3d is rotatably connected its base section to a top face of a leading edge section of the second arm 3. A first work supporting table 5 is provided at leading edge sections of both follower arms 2d and 3d . Both follower arms 2d and 3d are rotatably connected to the first work supporting table 5, and leading edge sections of both follower arms 2d and 3d are connected to one another by gear engagement (refer to FIG. 6), or crossed engagement of a belt (refer to FIG. 7) and the like within the first work supporting table 5, so that the first work supporting table 5 maintains its posture which is parallel with respect to a direction of rotation axis.

A follower arm 3e is rotatably connected its base section rotationally move corresponding arm. Therefore, the rotation axis unit 1, motors 2a , 3a and 4a for rotationally moving corresponding arm, and speed reducers 2b , 3b and 4b are moved upward and downward by operating the motor 8a for straight movement. Of course, it is preferable that a top plate 8e of the casing 8 and the rotation axis unit 1 are engaged to one another in an airtight manner.

Figure 8:
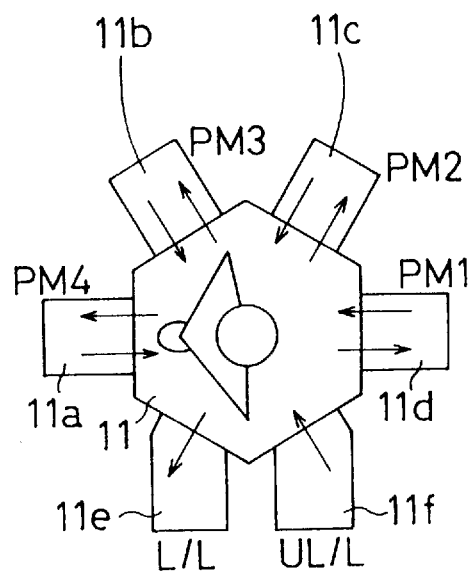
FIG. 8 is a plan view schematically illustrating a semiconductor device manufacturing system in which the work transporting robot is incorporated.

FIG. 8 is a plan view schematically illustrating a semiconductor device manufacturing system in which the work transporting robot is incorporated.

The system includes a central chamber 11, four process chambers 11a, 11b, 11c and 11d for manufacturing semiconductor device, a putting into section 11e for carrying a semiconductor wafer into the central chamber 11, and a putting out section 11f for carrying a semiconductor wafer out from the central chamber 11. The four process chambers 11a, 11b, 11c and 11d are disposed at peripheral portions of the central chamber 11. Further, an isolation valve is provided to each process chamber for manufacturing semiconductor device, putting into section and putting out section.

Figure 9:
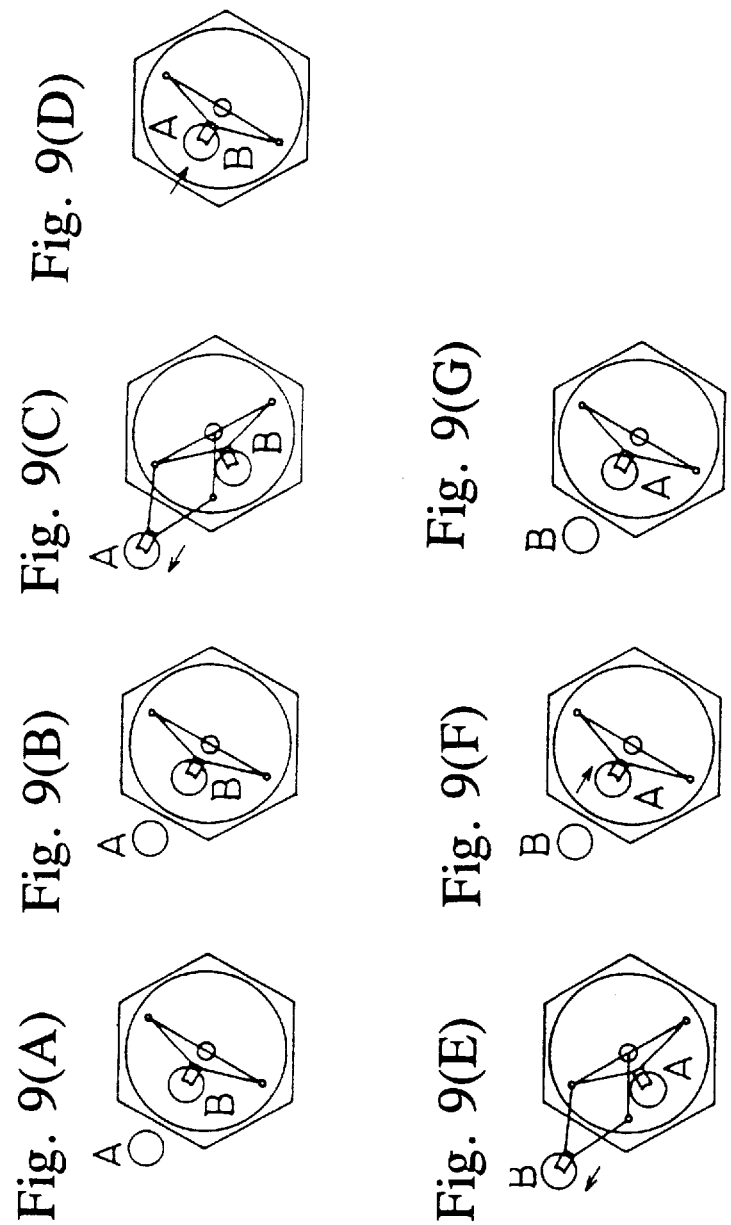
FIGS. 9(A) through 9(G) are diagrams useful for understanding an operation of the work transporting robot.
Figure 10:
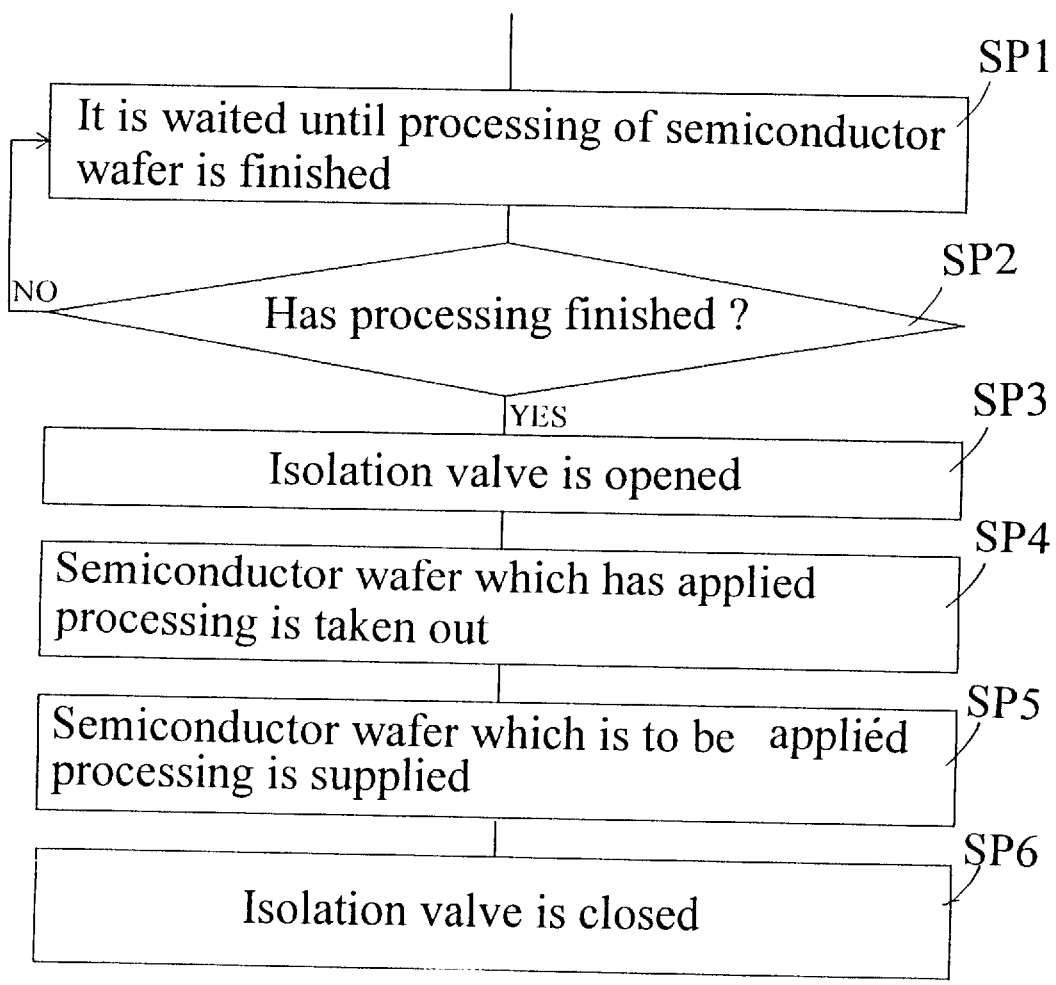
FIG. 10 is a flowchart explaining an operation of the work transporting robot.
Figure 11:
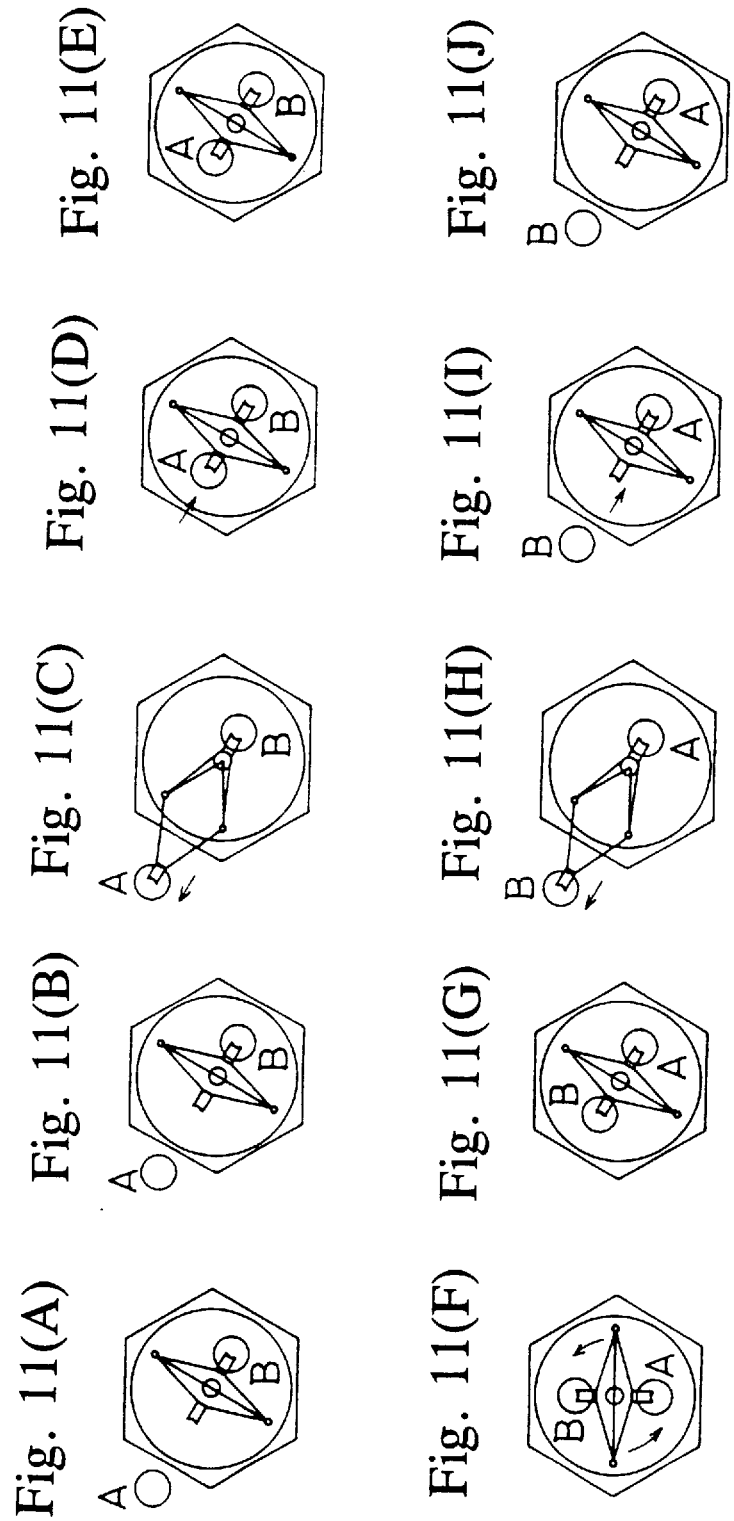
FIGS. 11(A) through 11(J) are diagrams useful for understanding an operation of a conventional work transporting robot.
Figure 12:
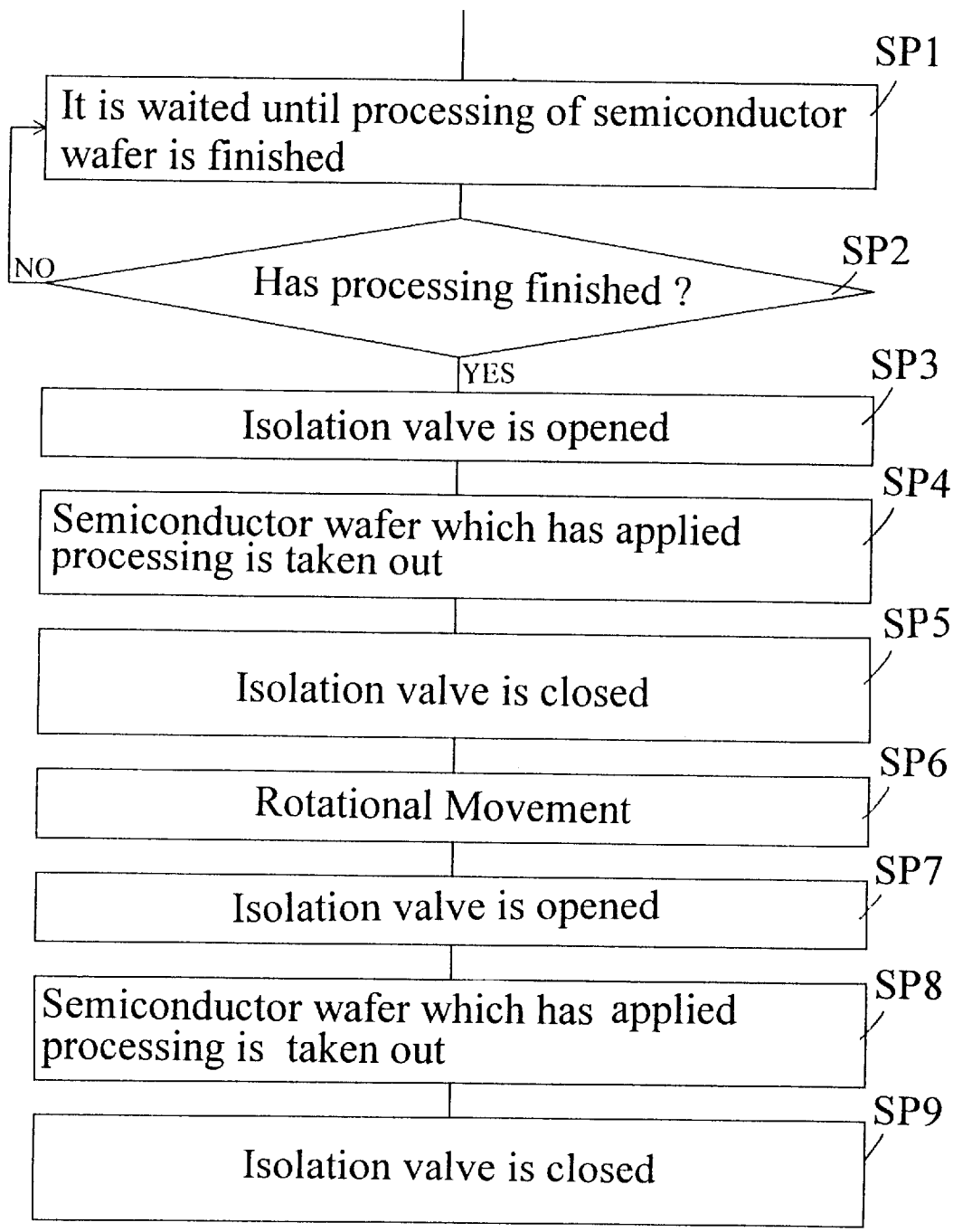
FIG. 12 is a flowchart explaining an operation of the conventional work transporting robot.

An operation of the semiconductor device manufacturing system having the above arrangement is described by referring to the operation explaining diagrams illustrated in FIGS. 9(A) through 9(G) and the flowchart illustrated in FIG. 10.

In steps SP1 and SP2, to a bottom face of a leading edge section of the second arm 3, and a follower arm 4e is rotatably connected its base section to a top face of a leading edge section of the third arm 4. A second work supporting table 6 is provided at leading edge sections of both follower arms 3e and 4e. Both follower arms 3e and 4e are rotatably connected to the second work supporting table 6, and leading edge sections of both follower arms 3e and 4e are connected to one another by gear engagement, or crossed engagement of a belt and the like within the second work supporting table 6, so that the second work supporting table 6 maintains its posture which is parallel with respect to a direction of rotation axis.

All follower arms are formed to have V-shapes, but they may be formed to have straight line shape. When all follower arms have straight line shape, no disadvantage arise.

The rotation axis unit 1, motors 2a, 3a and 3a for rotationally moving each arm, and speed reducers 2b, 3b and 4b are housed within a casing 8 in a moving upward and downward manner by guiding rails 9. The casing 8 is provided in a hanging manner to a base table 7 to which a robot is provided. A screw shaft 8b which is rotated by a motor 8a for straight movement which motor 8a is provided at a predetermined position of the casing 8, is engaged with a nut 8d which is provided at a predetermined position of a supporting base plate 8c for supporting motors which It is waited until processing of semiconductor wafer is finished In steps SP1 and SP2, It is waited until processing of semiconductor wafer is finished in the process chamber 11b for It is waited until processing of semiconductor wafer is finished In steps SP1 and SP2, It is waited until processing of semiconductor wafer is finishedmanufacturing semiconductor device is finished. Under this condition, the first and third arms 2 and 4 and the second arm 3 are rotationally moved in directions so that the first and third arms 2 and 4 and the second arm 3 are apart from one another. And, the first and second work supporting tables 5 and 6 move to positions which are most close to the rotation axis unit 1. The first and second work supporting tables 5 and 6 are opposite to one another in a vertical direction. These conditions are illustrated in FIG. 9(A).

When processing in the process chamber 11b for manufacturing semiconductor device is finished, in step SP3, the isolation valve is opened without moving the work transporting robot {refer to FIG. 9(B)}.

In step SP4, the first and second arms 2 and 3 are rotationally moved in directions for approaching both arms to one another so that the first work supporting table 5 is moved into the process chamber 11b for manufacturing semiconductor device. Then, both work supporting tables 5 and 6 are moved upward with the rotation axis unit 1 by operating the motor 8a for straight movement so that a semiconductor wafer which has applied processing is supported on the first work supporting table 5. Further, the third arm 4 is rotationally moved in the same moving direction by the same rotation angle of the second arm 2 simultaneous to the above movement of the first and second arms 2 and 3 so that the second work supporting table 6 is prevented from moving in radial direction. In this case, the second work supporting table 6 rotationally moves with respect to the rotation axis unit 1 without movement in radial direction, so that a disadvantage is prevented from occurrence that the second work supporting table 6 and a semiconductor wafer on the second work supporting table 6 strike against any one portion of the central chamber 11. These conditions are illustrated in FIG. 9(C). After the semiconductor wafer which has applied processing is supported on the first work supporting table 5, the first, second and third arms 2, 3 and 4 are rotationally moved in reversed directions to the above directions so that the first work supporting table 5 is moved backward and the first and second work supporting tables 5 and 6 are opposite to one another in a vertical direction {refer to FIG. 9(D)}.

In step SP5, the second and third arms 3 and 4 are rotationally moved in directions for approaching both arms to one another so that the second work supporting table 6 is moved into the process chamber 11b for manufacturing semiconductor device. Then, both work supporting tables 5 and 6 are moved downward with the rotation axis unit 1 by operating the motor 8a for straight movement so that a semiconductor wafer which is to be applied processing is supplied to the process chamber 11b for manufacturing semiconductor device. Further, the first arm 2 is rotationally moved in the same moving direction by the same rotation angle of the second arm 2 simultaneous to the above movement of the second and third arms 3 and 4 so that the first work supporting table 5 is prevented from moving in radial direction. In this case, the first work supporting table 5 rotationally moves with respect to the rotation axis unit 1 without movement in radial direction, so that a disadvantage is prevented from occurrence that the first work supporting table 5 and a semiconductor wafer on the first work supporting table 5 strike against any one portion of the central chamber 11. These conditions are illustrated in FIG. 9(E). After the semiconductor wafer which is to be applied processing is supplied to the process chamber 11b for manufacturing semiconductor device, the first, second and third arms 2, 3 and 4 are rotationally moved in reversed directions to the above directions so that the second work supporting table 6 is moved backward and the first and second work supporting tables 5 and 6 are opposite to one another in a vertical direction {refer to FIG. 9(F)}.

In step SP 6, the isolation valve is closed without moving the work transporting robot {refer to FIG. 9(G)}.

Thereafter, the first, second and third arms 2, 3 and 4 are rotationally moved in the same direction to one another by the same angle to one another so that the first and second work supporting tables 5 and 6 are opposite to another process chamber for manufacturing semiconductor device, and exchanging of a semiconductor wafer is achieved by performing an operation which is similar to the above operation.

As is apparent from the above description, both work supporting tables 5 and 6 are positioned in the same side to one another with respect to the rotation axis unit 1. Therefore, an operation for rotationally moving work supporting tables by 180 degrees is not necessary when a semiconductor wafer is exchanged for a process chamber for manufacturing semiconductor wafer, so that a semiconductor wafer can be supplied to a process chamber just after putting out another semiconductor wafer from the process chamber. Consequently, a required time for processing in an entirety is shortened. Further, a number of opening and closing of the isolation gate valve is reduced to half of a number of opening and closing of a conventional semiconductor device manufacturing system, so that a time during when the isolation gate valve is not closed is shortened. Consequently, a quantity of impurity particles which flows out from the process chamber for manufacturing semiconductor device through the isolation valve is decreased so that a high degree of cleanness is maintained.

Figure 13:
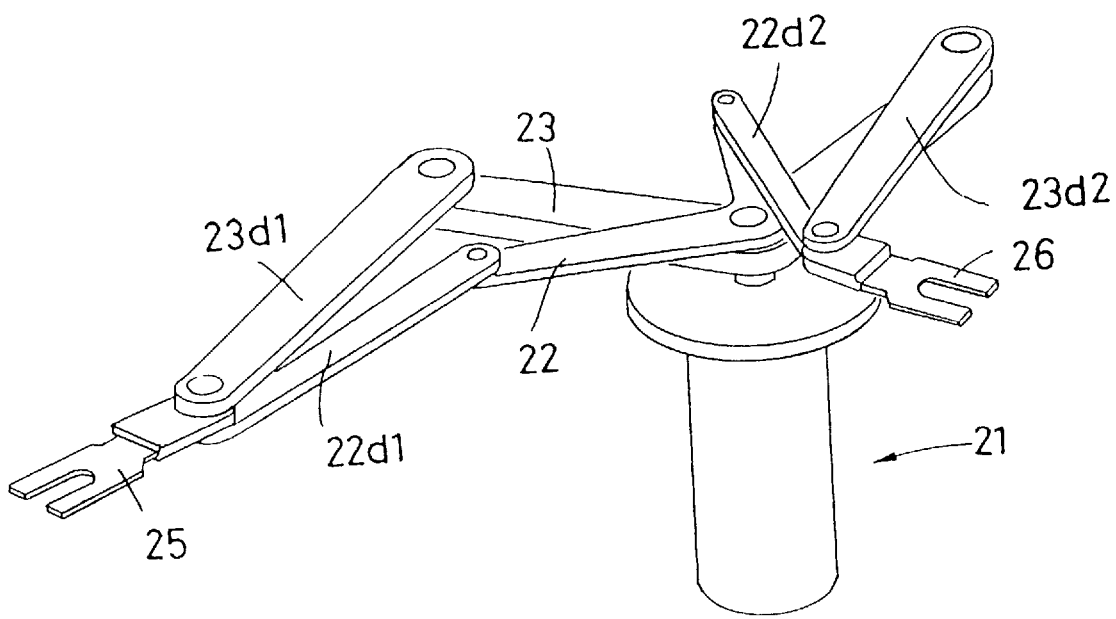
FIG. 13 is a perspective view schematically illustrating a main portion of a work transporting robot of another embodiment according to the present invention.
Figure 14:
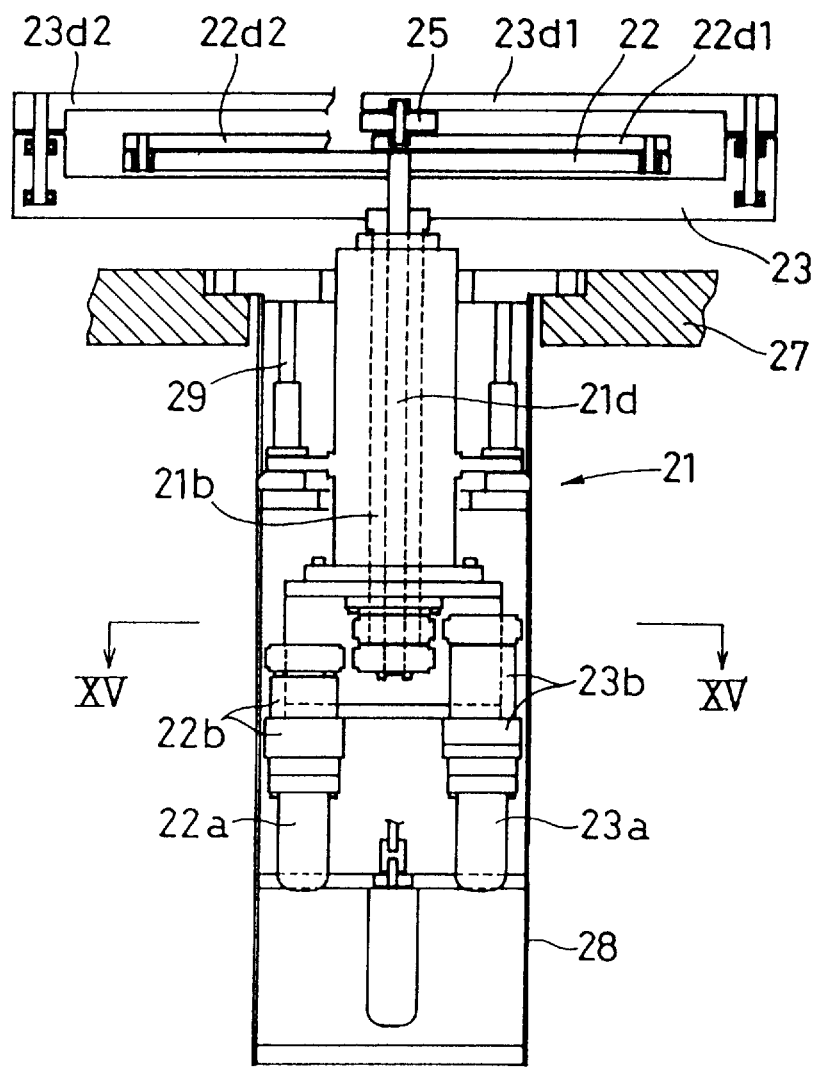
FIG. 14 is a central vertical cross sectional view of the work transporting robot.
Figure 15:
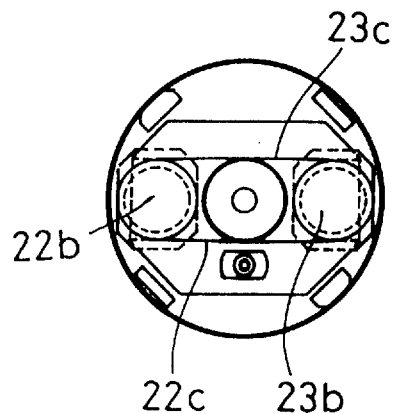
FIG. 15 is a cross sectional view taken along a line XV—XV in FIG. 14.
Figure 16:
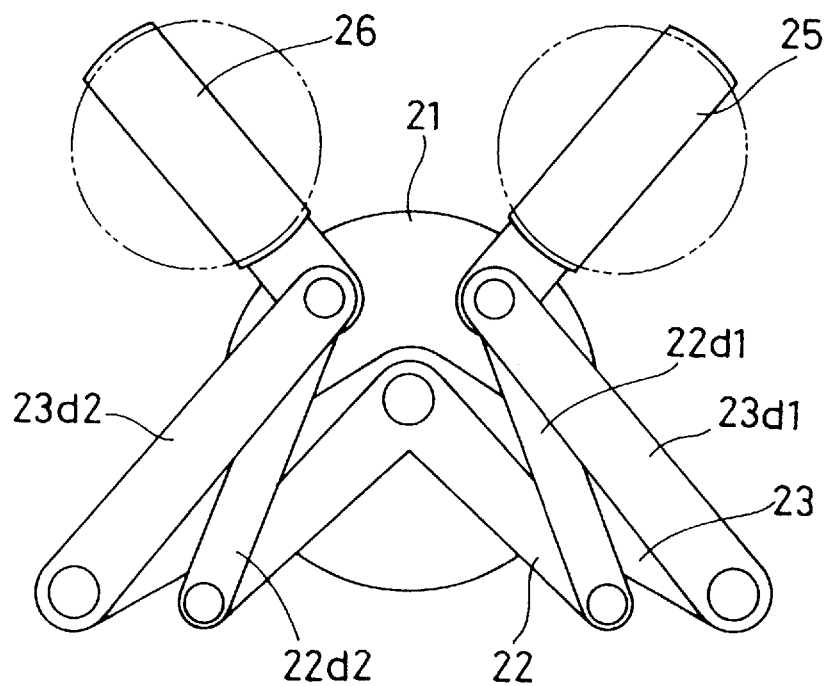
FIG. 16 is a plan view of the work transporting robot.
Figure 17:
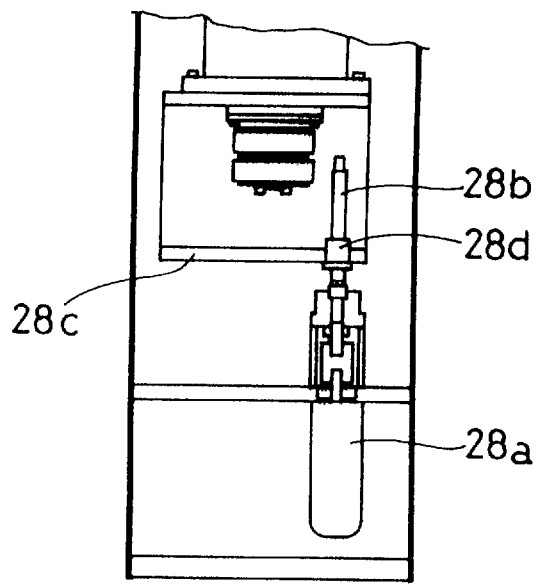
FIG. 17 is a cross sectional view illustrating a mechanism for moving the work transporting robot upward and downward.

FIG. 13 is a perspective view schematically illustrating a main portion of a work transporting robot of another embodiment according to the present invention, FIG. 14 is a central vertical cross sectional view of the work transporting robot, FIG. 15 is a cross sectional view taken along a line XV—XV in FIG. 14, FIG. 16 is a plan view of the work transporting robot, and FIG. 17 is a cross sectional view illustrating a mechanism for moving the work transporting robot upward and downward.

The work transporting robot includes a rotation axis unit 21 and a first and second arms 22 and 23. The rotation axis unit 21 has a coaxial two axes arrangement, and the rotation axis unit 21 dependently rotationally moves the first and second arms 22 and 23, respectively. The rotation axis unit 21 and each arm may be directly connected to one another. It is preferable that the rotation axis unit 21 and each arm are connected by a magnetic coupler through a wall of a vacuum case as is illustrated in Japanese Patent Laid-Open Gazette Hei 6-241237, when the work transporting robot is used for a purpose which requires a high degree of cleanness.

Each rotation axis 21a and 21b of the rotation axis unit 21 is connected to each speed reducer 22b and 23b by each belt 22c and 23c, respectively. Each speed reducer 22b and 23b is provided to each motor 22a and 23a for rotationally moving each arm, respectively. Of course, motors 22a and 23a for rotationally moving each arm are controlled their rotating directions and rotating speed and the like by controlling sections, respectively.

The first and second arms 22 and 23 are determined their lengths to be different from one another and are formed to have V-shapes. And, both arms 22 and 23 are connected to the rotation axis unit 21 at their bent portions. Further, in each arm, lengths from the bent portion to edge sections are determined to be the same to one another. That is, each arm has a line symmetry arrangement with respect to a straight line passing through the bent portion (an axis of symmetry). Further, an angle of the bent portion of the first arm 22 is determined to be smaller than an angle of the bent portion of the second arm 23.

Figure 18:
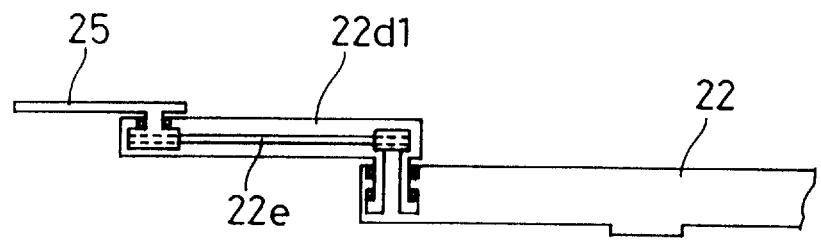
FIG. 18 is a diagram schematically illustrating a posture maintaining mechanism for a first work supporting table.

Follower arms 22d1 and 22d2 are rotatably connected their base sections to a top face of a leading edge section of the first arm 22. Follower arms 23d1 and 23d2 are rotatably connected their base sections to a top face of a leading edge section of the second arm 23. A first work supporting table 25 is provided to leading edge sections of the follower arms 22d1 and 23d1. A second work supporting table 26 is provided to leading edge sections of the follower arms 22d2 and 23d2. A belt 22e is provided between a rotatable connection section of the follower arm 22d1 to the first arm 22 and a rotatable connection section of the follower arm 22d1 to the first work supporting table 25 (refer to FIG. 18), so that the first work supporting table 25 always maintains a posture which is parallel to a rotation axis direction. The follower arm 22d2 has the similar engagement arrangement to that of the follower arm 22d1, so that the second work supporting table 26 always maintains a posture which is parallel to a rotation axis direction.

Figure 19A:
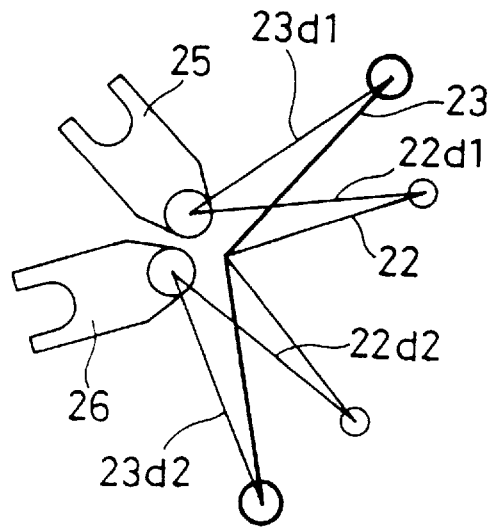
FIGS. 19(A) and 19(B) are diagrams schematically illustrating an operation of the work transporting robot illustrated in FIG. 13, FIGS. 20(A) through 20(F) are diagrams useful in understanding an operation of the work transporting robot illustrated in FIG. 13.
Figure 19B:
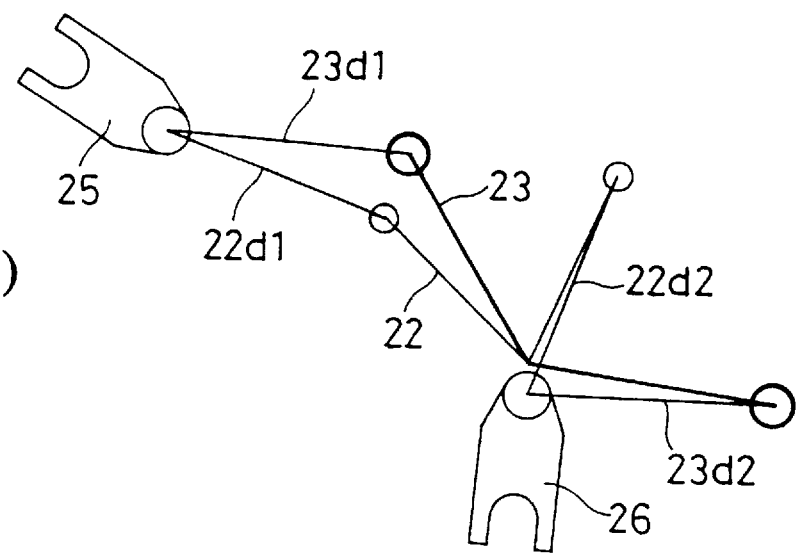
Figure 24:
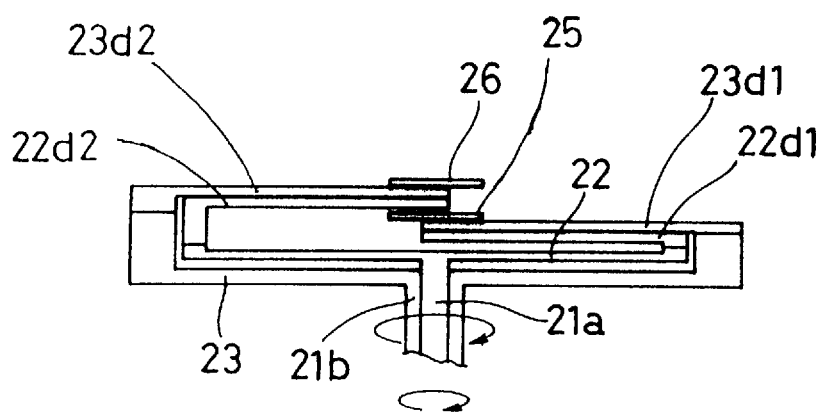
FIG. 24 is a plan view illustrating a work transporting robot of a further modified example.

Therefore, both work supporting tables 25 and 26 are moved closer to some degree to a rotation central axis of the rotation axis unit 21 and both work supporting table 25 and 26 are moved to approach to one another, by rotationally moving both arms 22 and 23 so that both axes of symmetry are coincident to one another, as is illustrated in FIG. 19(A). Then, the first work supporting table 25 is moved forward in a radial direction, and in simultaneous to the movement of the first work supporting table 25, the second work supporting table 26 is moved to a more closer position to the rotation central axis and is rotationally moved to some degree in an apart direction from the first work supporting table 25 with respect to the rotation central axis, as is illustrated in FIG. 19(B), by rotationally moving both arms 22 and 23 in the same directions to one another and approaching the connection side of the first arm 22 to the follower arm 22d1 to the connection side of the second arm 23 to the follower arm 23d1 (the former connection side may pass over the latter connection side) from the above condition. In this embodiment, both work supporting tables 25 and 26 cannot be opposite to one another in a vertical direction which opposition condition is possible in the first embodiment, because both work supporting tables 25 and 26 are supported at vertical positions which are the same to one another. But, it is possible that both work supporting tables 25 and 26 are opposite to one another in a vertical direction, by determining vertical positions of follower arms and connection positions of work supporting tables to be proper positions, as is illustrated in FIG. 24.

All follower arms are formed to have V-shapes, but they may be formed to have another shape. When all follower arms have another shape, no disadvantage arise.

The rotation axis unit 21, motors 22a and 23a for rotationally moving each arm, and speed reducers 22b and 23b are housed within a casing 28 in a moving upward and downward manner by guiding rails 29. The casing 28 is provided in a hanging manner to a base table 27 to which a robot is provided. A screw shaft 28b which is rotated by a motor 28a for straight movement which motor 28a is provided at a predetermined position of the casing 28, is engaged with a nut 28d which is provided at a predetermined position of a supporting base plate 28c for supporting motors which rotationally move corresponding arm. Therefore, the rotation axis unit 21, motors 22a and 23a for rotationally moving corresponding arm, and speed reducers 22b and 23b are moved upward and downward by operating the motor 28a for straight movement. Of course, it is preferable that a top plate 28e of the casing 28 and the rotation axis unit 21 are engaged to one another in an airtight manner.

A plan view schematically illustrating a semiconductor device manufacturing system in which the work transporting robot is incorporated is similar to FIG. 8, therefore detailed description is omitted.

Figure 20C:
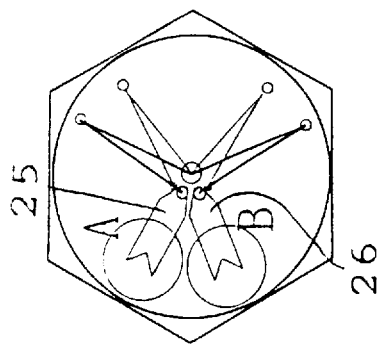
Figure 20F:
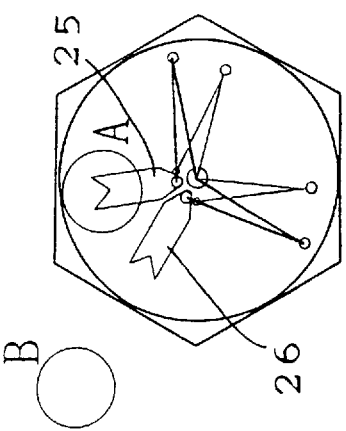
Figure 20B:
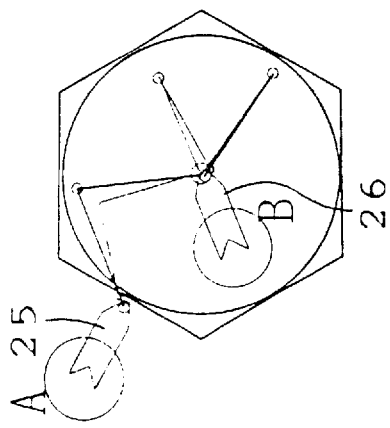
Figure 20E:
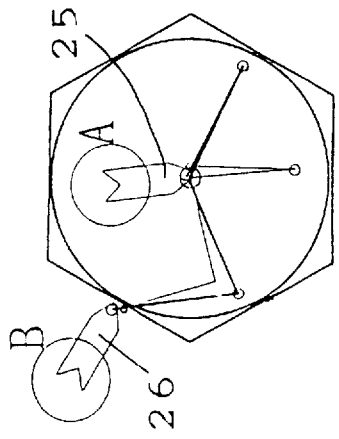
Figure 20A:
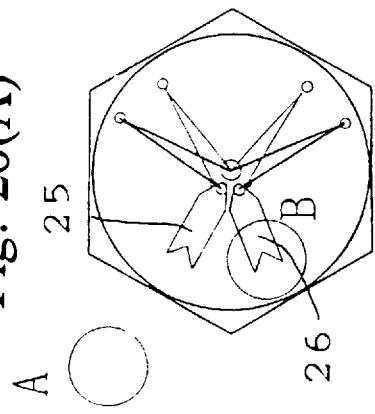
Figure 20D:
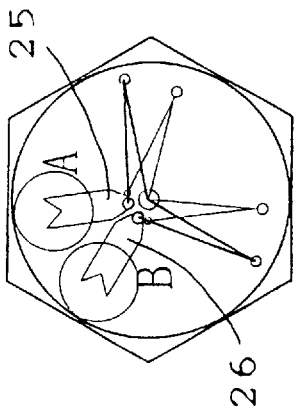
Figure 21:
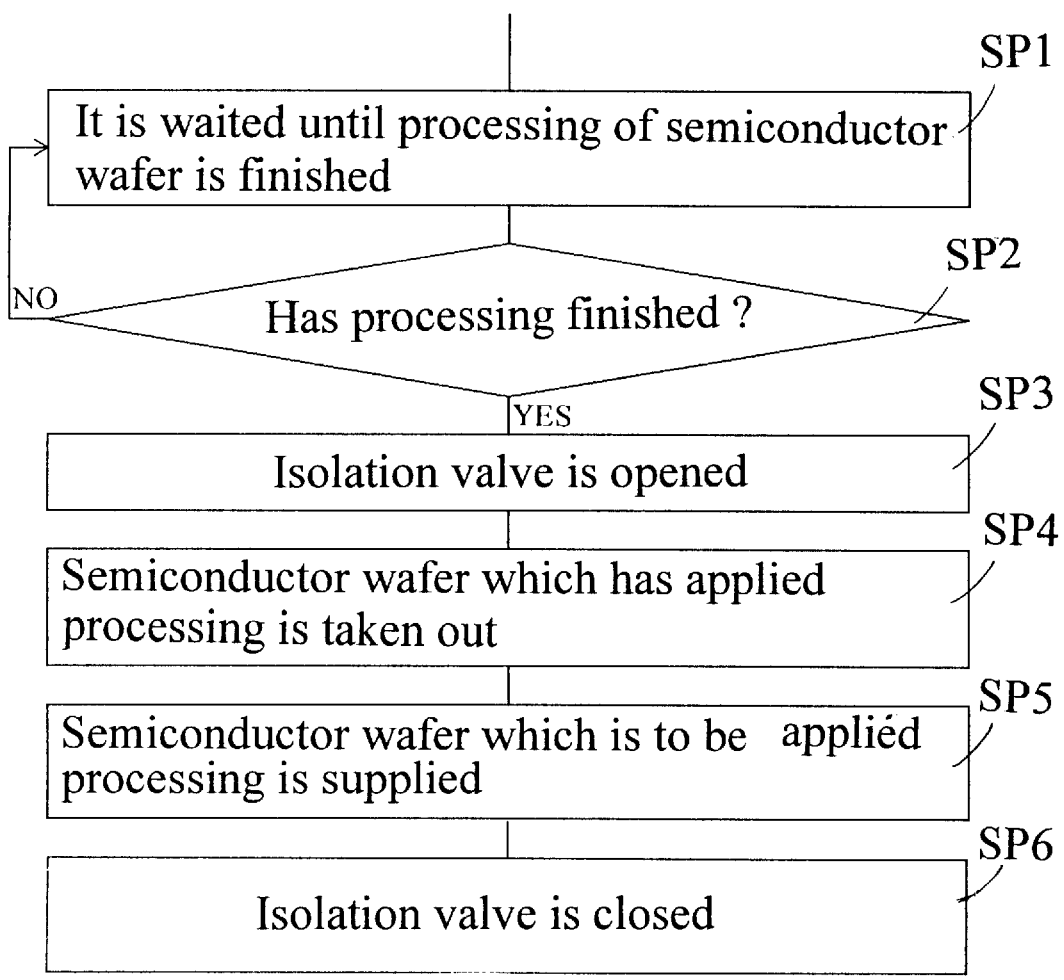
FIG. 21 is a flowchart explaining an operation of the work transporting robot illustrated in FIG. 13.

An operation of the semiconductor device manufacturing system having the above arrangement is described by referring to the operation explaining diagrams illustrated in FIGS. 20(A) through 20(F) and the flowchart illustrated in FIG. 21. In FIGS. 20(A) through 20(F), "A" represents a work (semiconductor wafer) which is to be exchanged, and "B" represents a new work for exchangement.

In steps SP1 and SP2, a semiconductor wafer is supported on the second work supporting table 26 and it is waited until processing in the process chamber 11b for manufacturing semiconductor device is finished. Under this condition, the both arms 22 and 23 are rotationally moved so that their axes of symmetry are coincident to one another. And, the first and second work supporting tables 25 and 26 move to positions which are closer to the rotation axis unit 1 to some degree. The first and second work supporting tables 25 and 26 are at positions which are the nearest positions to one another. These conditions are illustrated in FIG. 20(A).

When processing in the process chamber 11b for manufacturing semiconductor device is finished, in step SP3, the isolation valve is opened without moving the work transporting robot.

In step SP4, the both arms 22 and 23 are rotationally moved in the same directions to one another, and the connection side of the first arm 22 to the follower arm 22d1 passes over the connection side of the second arm 23 to the follower arm 23d1, and the both connection sides approach to one another, so that the first work supporting table 25 is moved forward in a radial direction and enters into the process chamber 11b for manufacturing semiconductor device. Then, both work supporting tables 25 and 26 are moved upward with the rotation axis unit 21 by operating the motor 28a for straight movement so that a semiconductor wafer which has applied processing is supported on the first work supporting table 25. These conditions are illustrated in FIG. 20(B). Further, the second work supporting table 26 slightly approaches to the rotation axis unit 21 simultaneous to the above movement of the first work supporting table 25. In this case, the second work supporting table 26 rotationally moves with respect to the rotation axis unit 21 with a slight backward movement in radial direction, so that a disadvantage is prevented from occurrence that the second work supporting table 26 and a semiconductor wafer on the second work supporting table 26 strike against any one portion of the central chamber 11 {refer to FIG. 20(B)}. After the semiconductor wafer which has applied processing is supported on the first work supporting table 25, the both arms 22 and 23 are rotationally moved in reversed directions to the above directions so that the first work supporting table 25 is moved backward and the first and second work supporting tables 25 and 26 approach to one another {refer to FIG. 20(C)}.

In step SP5, the both arms 22 and 23 are rotationally moved in the same directions by the same angle to one another so that the second work supporting table 26 is opposite to the process chamber 11b for manufacturing semiconductor device {refer to FIG. 20(D)}. Then, the both arms 22 and 23 are rotationally moved in the same directions to one another (reversed directions to the above directions), and the connection side of the first arm 22 to the follower arm 22d2 passes over the connection side of the second arm 23 to the follower arm 23d2, and the both connection sides approach to one another, so that the second work supporting table 26 is moved forward in a radial direction and enters into the process chamber 11b for manufacturing semiconductor device. Then, both work supporting tables 25 and 26 are moved downward with the rotation axis unit 21 by operating the motor 28a for straight movement so that a semiconductor wafer which is to be applied processing is supplied to the process chamber 11b for manufacturing semiconductor device. Further, the first work supporting table 25 slightly approaches to the rotation axis unit 21 simultaneous to the above movement of the second work supporting table 26. In this case, the first work supporting table 25 rotationally moves with respect to the rotation axis unit 21 with a slight backward movement in radial direction, so that a disadvantage is prevented from occurrence that the first work supporting table 25 and a semiconductor wafer on the first work supporting table 25 strike against any one portion of the central chamber 11 {refer to FIG. 20(E)}. After the semiconductor wafer which is to be applied processing is supplied to the process chamber 11b for manufacturing semiconductor device, the both arms 22 and 23 are rotationally moved in reversed directions so that the second work supporting table 26 is moved backward and the first and second work supporting tables 25 and 26 approach to one another {refer to FIG. 20(F)}.

In step SP 6, the isolation valve is closed without moving the work transporting robot.

Thereafter, the both arms 22 and 23 are rotationally moved in the same direction to one another by the same angle to one another so that the first and second work supporting tables 25 and 26 are opposite to another process chamber for manufacturing semiconductor device, and exchanging of a semiconductor wafer is achieved by performing an operation which is similar to the above operation.

As is apparent from the above description, both work supporting tables 25 and 26 are positioned in the same side to one another with respect to the rotation axis unit 21. Therefore, an operation for rotationally moving work supporting tables by 180 degrees is not necessary when a semiconductor wafer is exchanged for a process chamber for manufacturing semiconductor wafer, so that a semiconductor wafer can be supplied to a process chamber just after putting out another semiconductor wafer from the process chamber. Consequently, a required time for processing in an entirety is shortened. Further, a number of opening and closing of the isolation valve is reduced to half of a number of opening and closing of a conventional semiconductor device manufacturing system, so that a time during when the isolation valve is not closed is shortened. Consequently, a quantity of impurity particles which flows out from the process chamber for manufacturing semiconductor device through the isolation valve is decreased so that a high degree of cleanness is maintained.

Figure 25:
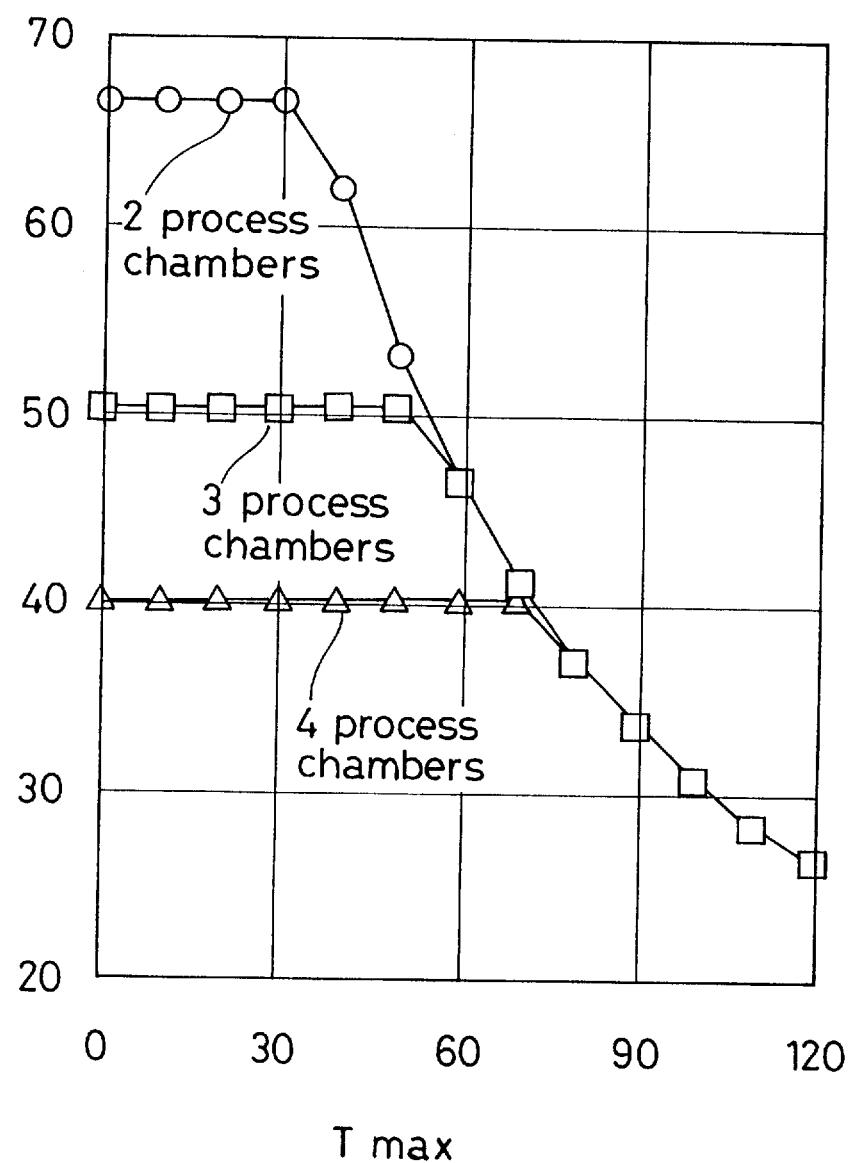
FIG. 25 is a diagram useful in understanding a relationship between a throughput and the longest process time of process modules.
Figure 26A:
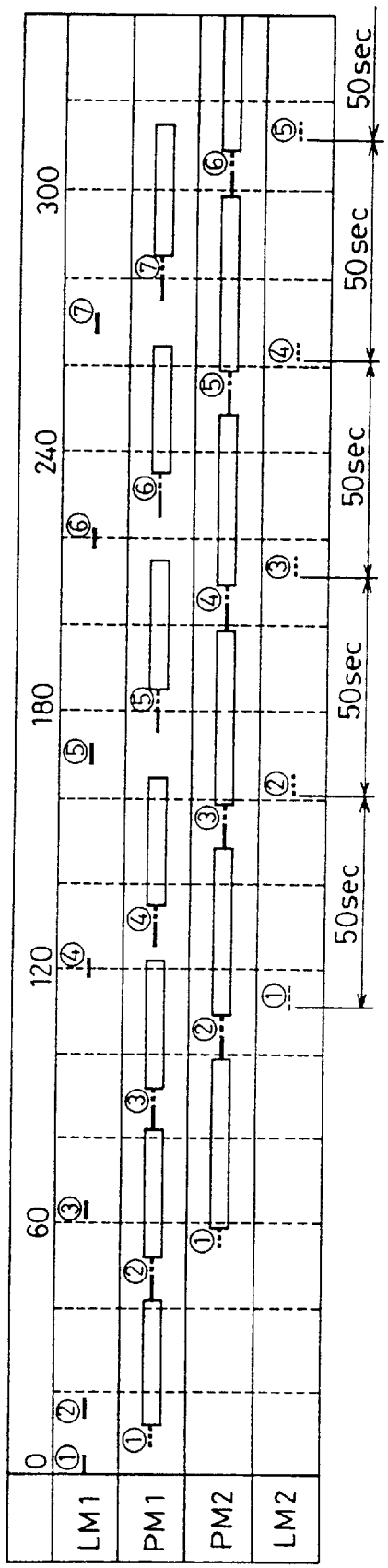
FIGS. 26(A) and 26(B) are time charts for transporting a semiconductor wafer.
Figure 26B:
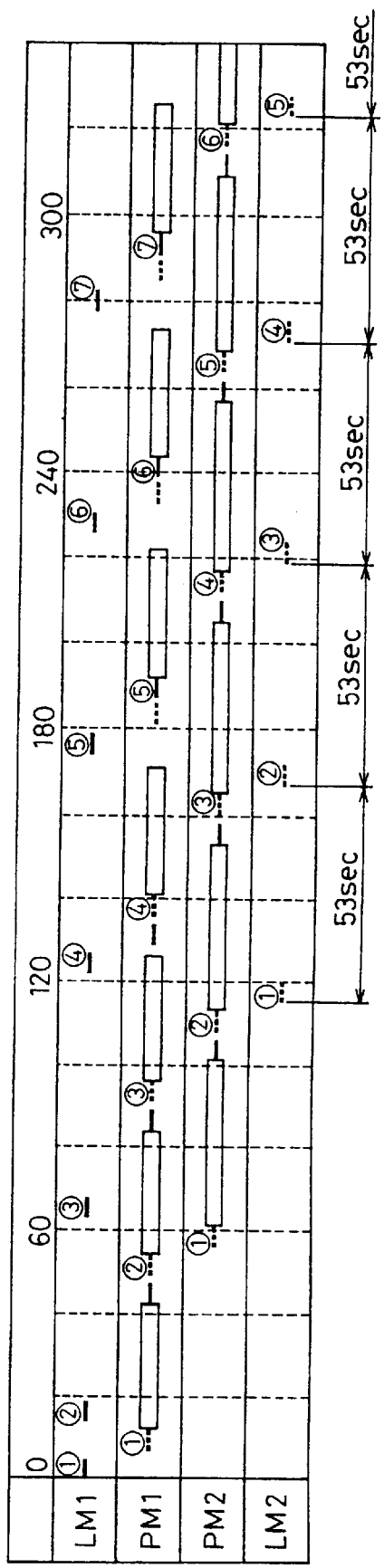

FIG. 25 is a diagram useful in understanding a relationship between a throughput and the longest process time of process modules, and FIGS. 26(A) and 26(B) are time charts for transporting a semiconductor wafer.

In FIGS. 26(A) and 26(B), "LM1" and "LM2" represent the putting into section and/or putting out section, and "PM1" and "PM2" represent the process chamber for manufacturing semiconductor device such as chemical vapor deposition chamber, sputtering chamber and the like. And circled numerals represent corresponding semiconductor wafers. Rectangular boxes represent processings in corresponding process chamber. Thick solid lines represent putting out operation of a semiconductor wafer. Thick dashed lines represent putting into operation of a semiconductor wafer. Spaces between the thick solid line and the thick dashed line represent rotational movement by 180 degrees of arms. In this specific example, a putting out operation time is determined to be 5 sec, a putting into operation time is determined to be 5 sec, a rotational movement time is determined to be 3 sec, a process time in the process chamber PM1 is determined to be 30 msec, and a process time in the process chamber PM2 is determined to be 40 msec. Also, in FIG. 25, "Tmax" represents the longest process time, and throughput represents processable number of semiconductor wafers per hour.

As is apparent from FIGS. 26(A) and 26(B), a total required time is shortened by employing the work transporting robot according to the present invention than that of the conventional work transporting robot. Of course, throughput is improved by shortening the total required time.

Figure 22:
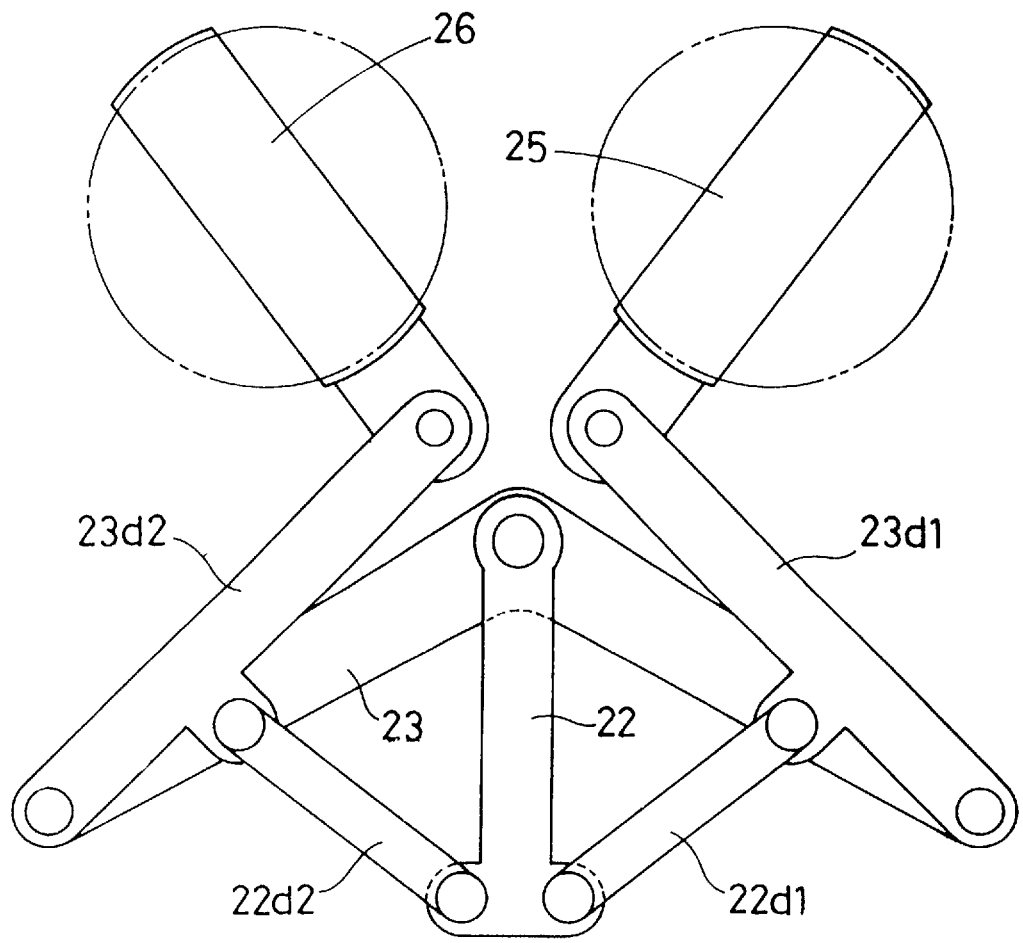
FIG. 22 is a plan view illustrating a work transporting robot of a modified example.

FIG. 22 is a plan view illustrating a work transporting robot of a modified example.

The work transporting robot differs from the above work transporting robot (especially, refer to FIG. 16) in a shape of the first arm 22, and connection arrangements of the follower arms 22d1 and 22d2 to the follower arms 23d1 and 23d2.

That is, the first arm 22 has an approximate T-shape. A leading edge section of a central arm section of the first arm 22 is connected to the rotation axis unit 21. And, one edge sections of the follower arms 22d1 and 22d2 are rotatably connected to leading edge sections of other two arm sections of the first arm 22, respectively. Other edge sections of the follower arms 22d1 and 22d2 are rotatably connected to central sections of the follower arms 23d1 and 23d2, respectively.

When the work transporting robot having the arrangement is employed, the first work supporting table 25 is moved forward and backward following a change of relative positions of connection sections of the follower arms 22d1 and 23d1 to the first and second arms 22 and 23, and the second work supporting table 26 is moved forward and backward following a change of relative positions of connection sections of the follower arms 22d2 and 23d2 to the first and second arms 22 and 23, so that an operation which is similar to that of the above embodiment can be performed.

Figure 23:
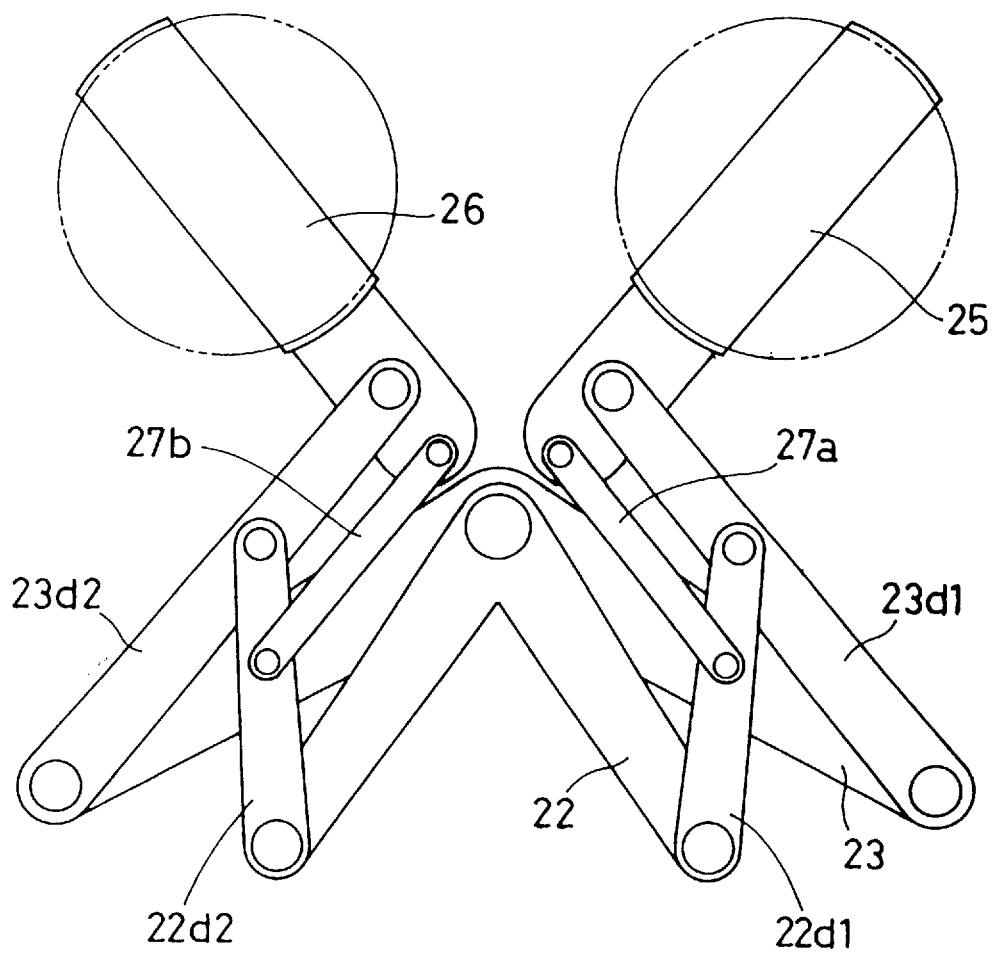
FIG. 23 is a plan view illustrating a work transporting robot of another modified example.

In such embodiment, it is preferable that link members 27a and 27b are provided between the central predetermined positions of the follower arms 22d1 and 22d2 and edge sections of the first and second work supporting tables 25 and 26 (edge sections of elongate portion which elongate from connection section of the first and second work supporting table 25 and 26 to the follower arms 23d1 and 23d2, respectively), respectively. Thereby, the both work supporting tables 25 and 26 maintain their postures to be constant postures despite of moving forward and backward of the both work supporting tables 25 and 26. Further, the first arm 22 having V-shape is employed in FIG. 23 which shape is different from that of FIG. 22.

The above description was made for cases in which the work transporting robot is applied to a semiconductor device manufacturing system. The work transporting robot can be applied to an apparatus similarly which apparatus requires exchanging of a work for one process section, so that a required time for exchanging a work is shortened.

What is claimed is:

1. A work transporting robot comprising, first, second and third arms each of which is rotationally moved within a plane around a common axis by an individual driving source, the planes being parallel to one another, a first pair of coupled arms with ends which are coupled together, said first pair of coupled arms being rotatably connected at one end to the second arm and connected at the other end to the first arm, a first work supporting table which is connected to the coupled ends of the first pair of coupled arms, a second pair of coupled arms with ends which are coupled together, said second pair of coupled arms being rotatably connected at one end to the second arm and connected at the other end to the third arm, a second work supporting table which is connected to the coupled ends of the second pair of coupled arms, the first and third arms both being movable to positions located on a same side of a plane which includes the axis and the second arm.

2. A work transporting robot as set forth in claim 1, further comprising a plurality of process chambers for manufacturing semiconductor devices, said process chambers being disposed in correspondence to predetermined rotation positions of the work supporting tables around the axis, and a controller for controlling the driving sources to rotationally move the first, second and third arms in the same directions and by the same angles to move one of the work supporting tables to a position which is opposite to any one of the process chambers for manufacturing semiconductor devices, said driving sources rotationally moving the first and second arms or the second and third arms in opposite directions to one another and rotationally moving the remaining arm in a direction which is the same as the direction of the second arm when exchanging a semiconductor wafer for a process chamber.

3. A work transporting robot as set forth in claim 1, further comprising a controller for controlling the driving sources to rotationally move the first, second and third arms in the same directions and by the same angles to move one of the work supporting tables to a predetermined position, said driving sources being operable to move a said work supporting table outwardly from said predetermined position by rotationally moving the first and second arms or the second and third arms in opposite directions to one another and rotationally moving the remaining arm in a direction which is the same as the direction of the second arm.

4. A work transporting robot comprising, first and second arms each of which is rotationally moved within a plane around a common axis by an individual driving source, the planes being parallel to one another, the first and second arms each having first and second arm sections which extend from a central section which is at said axis, said arm sections of said first arm having lengths which are different from the lengths of the arm sections of the second arm, and a first pair of coupled arms, one of which is rotatably connected to a first arm portion of the first arm and a another of which is rotatably connected to a first arm portion of the second arm, said arms of said first pair of coupled arms being connected to one another, and a work supporting table connected to one of the first pair of coupled arms, a second pair of coupled arms, one of which is connected to a second arm portion of the first arm and the other of which is connected to a second arm portion of the second arm, said second pair of coupled arms being connected to one another, and a work supporting table connected to one of the second pair of coupled arms.

5. A work transporting robot as set forth in claim 4, further comprising a plurality of process chambers for manufacturing semiconductor devices, said chambers being disposed in correspondence to predetermined rotation positions of the work supporting tables around the axis, and a controlling means is further provided for controlling the driving sources which rotationally move the first and second arms in the same direction by the same angles when one of the work supporting tables is opposite to any one of the process chambers for manufacturing semiconductor device, said driving sources rotationally moving the first and second arms in the same direction and by different angles from one another when exchanging a semiconductor wafer for a process chamber.

6. A work transporting robot as set forth in claim 4, further comprising a controller for controlling the driving sources to rotationally move the first and second arms in the same direction by the same angles to move one of the work supporting tables to a predetermined position, said driving sources being operable to move a work supporting table outwardly from said predetermined position by rotationally moving the first and second arms in the same direction and by different angles from one another.

7. A semiconductor device manufacturing apparatus comprising, a central chamber, a plurality of process chambers each of which is disposed at a predetermined position of the central chamber, and a work transporting robot which is in the central chamber, said work transporting robot including:

first, second and third arms each of which is rotationally moved within a plane around a common axis by an individual driving source, the planes being parallel to one another, a first pair of coupled arms with ends which are coupled together, said first pair of coupled arms being rotatably connected at one end to the second arm and connected at the other end to the first arm, a first work supporting table which is connected to the coupled ends of the first pair of coupled arms, a second pair of coupled arms with ends which are coupled together, said second pair of coupled arms being rotatably connected at one end to the second arm and connected at the other end to the third arm, a second work supporting table which is connected to the coupled ends of the second pair of coupled arms, the first and third arms both being movable to positions located on a same side of a plane which includes the axis and the second arm.

8. A semiconductor device manufacturing apparatus comprising, a central chamber, a plurality of process chambers each of which is disposed at a predetermined position of the central chamber, a work transporting robot which is in the central chamber, said work transporting robot including:

first and second arms each of which is rotationally moved within a plane around a common axis by an individual driving source, the planes being parallel to one another, the first and second arms each having first and second arm sections which extend from a central section which is at said axis, said arm sections of said first arm having lengths which are different from the lengths of the arm sections of the second arm, and a first pair of coupled arms, one of which is rotatably connected to a first arm portion of the first arm and a another of which is rotatably connected to a first arm portion of the second arm, said arms of said first pair of coupled arms being connected to one another, and a work supporting table connected to one of the first pair of coupled arms, a second pair of coupled arms, one of which is connected to a second arm portion of the first arm and the other of which is connected to a second arm portion of the second arm, said second pair of coupled arms being connected to one another, and a work supporting table connected to one of the second pair of coupled arms.

\* \* \* \* \*